United States Patent
Zhao et al.

(10) Patent No.: US 7,607,647 B2
(45) Date of Patent: Oct. 27, 2009

(54) STABILIZING A SUBSTRATE USING A VACUUM PRELOAD AIR BEARING CHUCK

(75) Inventors: Guoheng Zhao, Milpitas, CA (US); Alexander Belyaev, Mountain View, CA (US); Christian H. Wolters, Campbell, CA (US); Paul Andrew Doyle, San Jose, CA (US); Howard W. Dando, Rio Del Mar, CA (US); Mehdi Vaez-Iravani, Los Gatos, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 122 days.

(21) Appl. No.: 11/688,720

(22) Filed: Mar. 20, 2007

(65) Prior Publication Data

US 2008/0229811 A1 Sep. 25, 2008

(51) Int. Cl.
*B25B 11/00* (2006.01)
(52) U.S. Cl. .............................. 269/21; 269/20; 269/56; 269/57
(58) Field of Classification Search ................. 73/865.8; 324/500, 501, 537, 750–760; 269/20, 21, 269/56, 57
See application file for complete search history.

(56) References Cited

U.S. PATENT DOCUMENTS

| | | | | |
|---|---|---|---|---|
| 5,160,883 A | | 11/1992 | Blanz | 324/760 |
| 5,191,218 A | * | 3/1993 | Mori et al. | 250/453.11 |
| 5,374,829 A | * | 12/1994 | Sakamoto et al. | 250/453.11 |
| 5,511,005 A | | 4/1996 | Abbe et al. | 702/84 |
| 5,564,682 A | * | 10/1996 | Tsuji | 269/21 |
| 5,857,667 A | * | 1/1999 | Lee | 269/21 |
| 6,257,564 B1 | * | 7/2001 | Avneri et al. | 269/21 |
| 6,623,329 B1 | * | 9/2003 | Moore | 451/5 |
| 6,695,687 B2 | * | 2/2004 | Hollatz et al. | 451/288 |
| 6,746,022 B2 | * | 6/2004 | Cheung et al. | 279/3 |
| 6,822,407 B2 | * | 11/2004 | Hunter | 318/135 |
| 7,028,595 B2 | * | 4/2006 | Ben-Menachem et al. | 82/1.3 |
| 7,282,930 B2 | * | 10/2007 | Beier et al. | 324/752 |
| 7,301,606 B2 | * | 11/2007 | Arai | 355/72 |
| 2002/0117792 A1 | * | 8/2002 | Leidy et al. | 269/21 |
| 2003/0001103 A1 | * | 1/2003 | Kobayashi et al. | 250/440.11 |
| 2003/0075849 A1 | * | 4/2003 | Choi | 269/21 |
| 2004/0012775 A1 | * | 1/2004 | Kinney et al. | 356/237.2 |
| 2004/0211285 A1 | * | 10/2004 | Hunter | 74/490.08 |
| 2005/0012920 A1 | | 1/2005 | Jeanne et al. | 355/72 |
| 2005/0102108 A1 | * | 5/2005 | Ramachandran et al. | 702/30 |

(Continued)

FOREIGN PATENT DOCUMENTS

WO WO 2006/023595 3/2006

OTHER PUBLICATIONS

New Way® Air Bearings—Vaccuum Preloaded Air Bearings, © 2005, New Way Air Bearings, Aston, PA, downloaded from the internet, downloaded from <http://www.newwayairbearings.com/Family.asp?FamilyID=796&Cat1ID=1156&Cat2ID = 280&FamilyName=Vacuum%20Preloaded%20Air%20BearingsCatIName=Products&Cat2Name=Vacuum% 20 Preloaded % 20Air%20Bearings> on Aug. 8, 2007.

*Primary Examiner*—David A. Rogers
(74) *Attorney, Agent, or Firm*—Joshua D. Isenberg; JDI Patent

(57) ABSTRACT

Substrate processing method and apparatus are disclosed. The substrate processing apparatus includes a non-contact air bearing chuck with a vacuum preload.

41 Claims, 7 Drawing Sheets

U.S. PATENT DOCUMENTS

| | | |
|---|---|---|
| 2005/0162178 A1* | 7/2005 | Steele et al. ............... 324/755 |
| 2006/0121832 A1* | 6/2006 | Allaire et al. ............... 451/11 |
| 2007/0252970 A1* | 11/2007 | Shibazaki ................... 355/72 |
| 2008/0013060 A1* | 1/2008 | Ichinose et al. ............. 355/53 |
| 2008/0047577 A1* | 2/2008 | Goto et al. .................. 134/1 |
| 2008/0142733 A1* | 6/2008 | Zywno et al. ............ 250/491.1 |
| 2008/0151213 A1* | 6/2008 | Arai ........................... 355/72 |
| 2008/0192226 A1* | 8/2008 | Shibazaki ................... 355/72 |
| 2008/0198485 A1* | 8/2008 | Kosmowski ............... 359/811 |

* cited by examiner

STABILIZING A SUBSTRATE USING A VACUUM PRELOAD AIR BEARING CHUCK

FIELD OF THE INVENTION

This invention generally relates to stabilizing a wafer and more particularly to wafer handling with a vacuum preload air bearing chuck.

BACKGROUND OF THE INVENTION

Mechanisms used to examine the surface of a semiconductor wafer commonly use a wafer support known as a handling chuck. Modern semiconductor wafer inspection techniques may entail incrementally inspecting the surface of the wafer with a probe that moves laterally as the wafer rotates, much like a phonograph needle passes over a phonograph record. As may be appreciated, the greater the speed of rotation, the larger the number of sample wafers which may be examined for a given time.

Conventionally the wafer is mounted on an edge handling chuck and supported at three or four points at the edge of the wafer, e.g., using an edge clamp ring that is secured to the chuck. Air passes through a center hole in the chuck and is dispersed to the atmosphere using multiple pressure relief openings in the chuck near the edge of the wafer. The air pressure supports the wafer against the tendency to sag. The vacuum chuck is mounted on a spindle to permit rotation of the chuck and the wafer. During high-speed rotation, the gap between the wafer surface and the probe may vary due to wobble of spindle and chuck non-flatness. Such gap variation may be tolerable for a low-resolution scan, where the depth of focus is large. However, as the spot size of the "probe" reduces due to the requirement of improved sensitivity, the depth of focus reduces. For probes having a very small depth of focus, it is often necessary to adjust the focus for high-speed variations in the wafer height due to non-flatness and high speed of rotation of the chuck. Auto focus systems typically have limited bandwidths, which make it difficult to track wafer height variations at high rotational speeds. In addition, contact between the back surface of the wafer and the chuck surface may generate numerous particles, which can contaminate the wafer above an acceptable level and reduce the yield of usable devices from the wafer.

U.S. Pat. No. 5,511,005 describes a system for wafer processing including wafer measurement and characterization having vertical processing apparatus in which only the edge of the wafer is contacted as the wafer is rotated in a vertical plane. Since the wafer is held vertical as it rotates, particulate contamination and distortion of the wafer may be reduced due to the effects of the gravity. However, most current processing tools for measurement and characterization of semiconductor wafer are set up to measure or process a wafer oriented in a horizontal plane. Thus, vertical wafer rotation would probably require substantial and expensive reconfiguration, re-engineering and redesign and perhaps replacement of semiconductor wafer tools.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Recently, vacuum preload air-bearings have been developed. A vacuum preload air bearing generally uses a combination of vacuum and air pressure to lift a load without contacting it. A vacuum preload air-bearing generally comprises a manifold having a central vacuum port surrounded by one or more air pressure ports. Vacuum is applied to the vacuum port and air pressure is provided to the air pressure ports. The combination of vacuum and air pressure provides both a lifting force and an air cushion that keeps the load from contacting the manifold. Examples of such vacuum pre-load air-bearings are commercially available from New Way Air Bearings of Aston, Pa. Such vacuum preload air-bearings have certain disadvantages for substrate processing. First, they are designed to lift heavy and relatively rigid loads from above. Substrate processing often involves supporting a thin and flexible substrate from below. Furthermore, the central location of a relatively large vacuum port tends to concentrate the vacuum force, which may cause deformation of the substrate, e.g., in the form of bowing towards the vacuum port.

Figure 1:
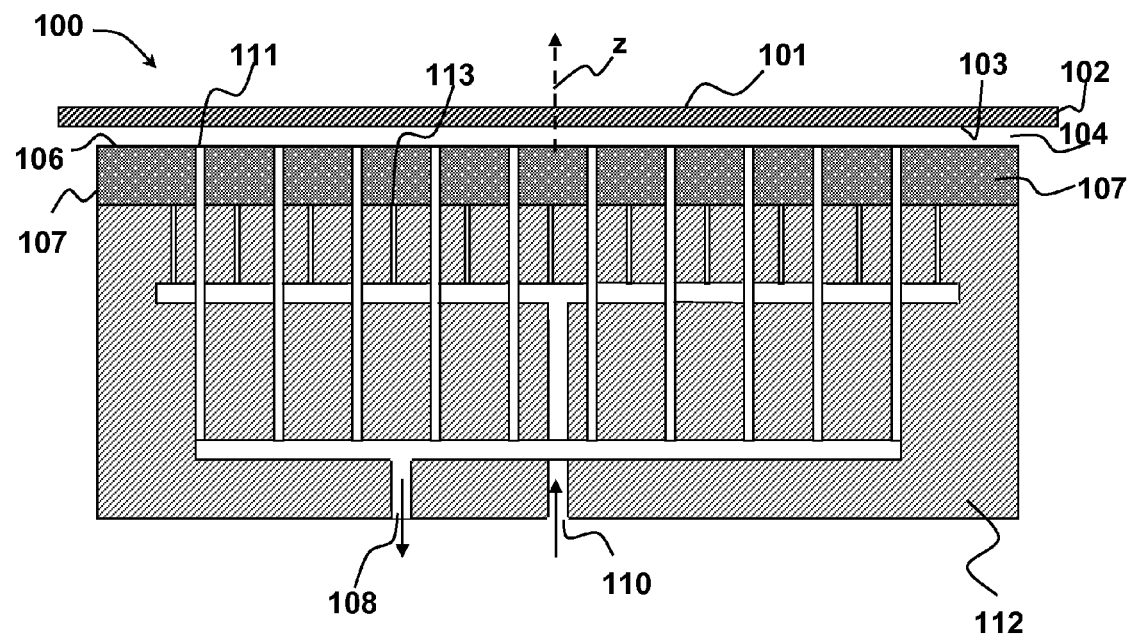
FIG. 1 is a cross-sectional schematic diagram of a substrate processing apparatus including a vacuum preload air bearing chuck according to an embodiment of the present invention.

In certain embodiments of the present invention, by contrast, one or more vacuum ports may be distributed across a surface of a chuck to disperse the vacuum force. FIG. 1 is a cross-sectional view of a substrate processing apparatus 100 of a preferred embodiment of the present invention. As shown in FIG. 1, the substrate processing apparatus 100 includes a chuck 112 having a surface 106. The surface 106 includes one or more gas flow openings 113 configured to provide a flow of gas 110 to the surface 106 and one or more vacuum channels 111 distributed across the surface 106. The gas flow openings may be coupled to a source of the gas 110 by a network of gas channels in the body of the chuck 112. A porous material 107 may optionally be disposed between the gas flow openings 113 and the surface 106 to diffuse the flow of gas. For example, the surface 106 can be made of a porous material, preferably sintered metal powder, such as sintered Nickel powder. Alternatively, the surface 106 can be a solid metal or ceramic surface with holes that communicate with the network of gas channels. The vacuum channels 111 are configured to permit vacuum 108 to be drawn therethrough. By way of example, the vacuum channels 111 may be coupled to a source of vacuum (e.g., a vacuum pump) by a network of channels in the body of the chuck 112. A substrate 102, such as a reticle or a semiconductor wafer, can freely float on a thin layer of pressurized gas layer 104 on top of the chuck 112 without being in contact with the chuck surface 106. The substrate 102 is simultaneously vacuumed down towards the chuck surface 106 by a vacuum preload exerted through the vacuum channels 111 to provide a high degree of rigidity that stabilizes the wafer during high speed rotation.

Figure 2A:
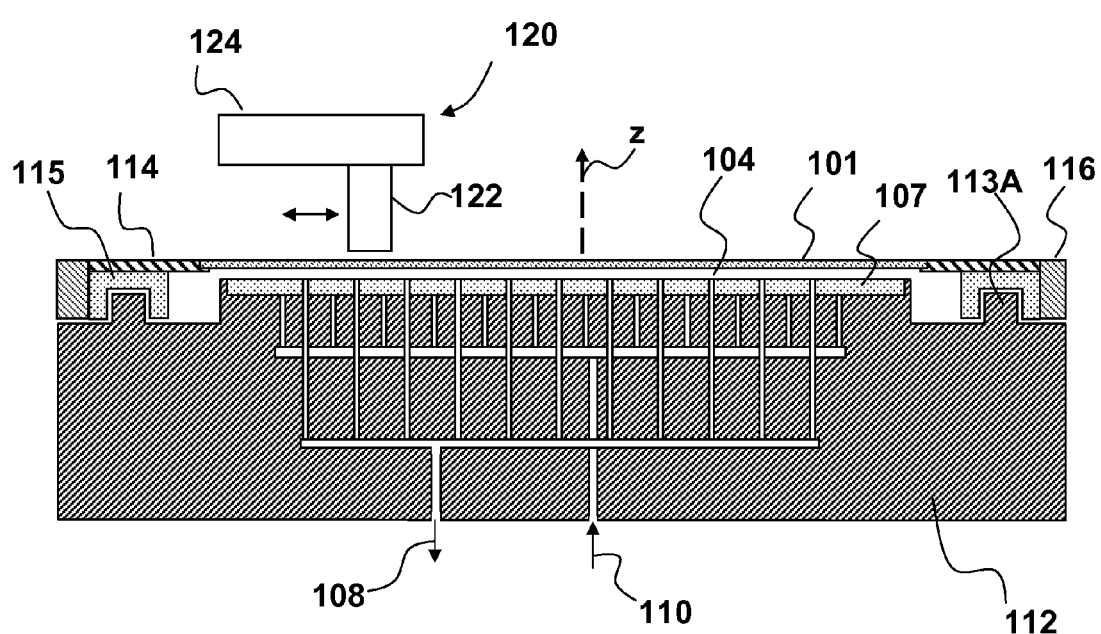
FIGS. 2A-2F are cross-sectional schematic diagrams of alternative substrate processing apparatus including a vacuum preload air bearing chuck with substrate edge support.

In some embodiments, the apparatus 100 may include a substrate support configured to support a substrate in an orientation substantially parallel to the surface of the chuck. The substrate support may be adapted to move along a direction that is substantially parallel to the surface of the substrate. For example, the substrate 102 may be supported in an orientation substantially parallel to the surface of the chuck 112 by a substrate support that is configured to rotate the substrate in a substantially horizontal plane. For example, as shown in FIG. 2A, the substrate 102 may be supported at the edge thereof by a substrate edge support 114, adapted to rotate about an axis z that is substantially perpendicular to the surface of the substrate 102. The substrate edge support 114 can rotate independent of the chuck 112, thereby permitting rotation of the substrate 102 without rotating the chuck 112. The substrate edge support 114 may be maintained proximate the surface 106 in a fixed position relative to the chuck during rotation, e.g., using a bearing 115. Any suitable type of bearing design may be used for the bearing 115. Examples of possible bearing designs include mechanical, e.g., ball or roller bearings, magnetic levitation (maglev) bearings, air bearing and the like. A rotation mechanism 116 imparts rotational motion to the edge support 114 about the axis z. Any suitable design of rotation mechanism may be used. By way of example, the rotation mechanism 116 may be a linear magnetic drive motor, the rotor of an electric motor, or an electric motor combined with a belt or friction drive.

Figure 2B:
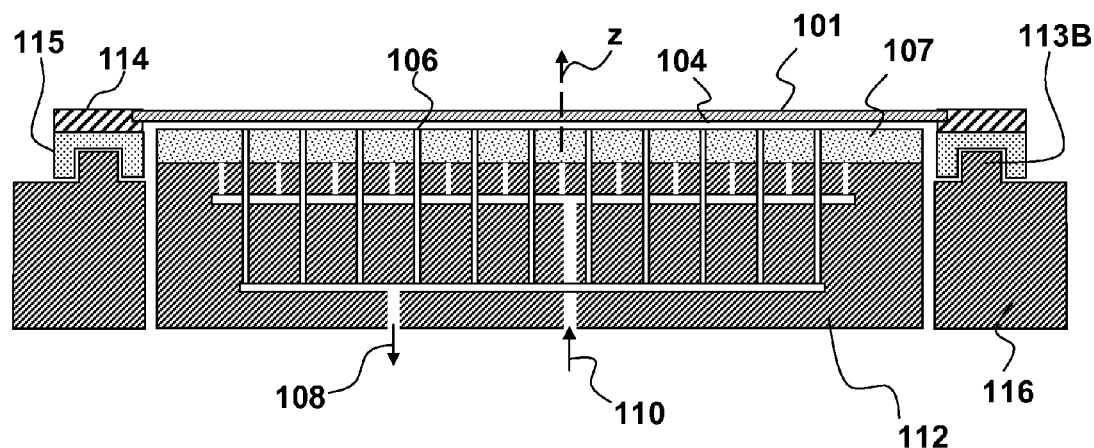
Figure 2C:
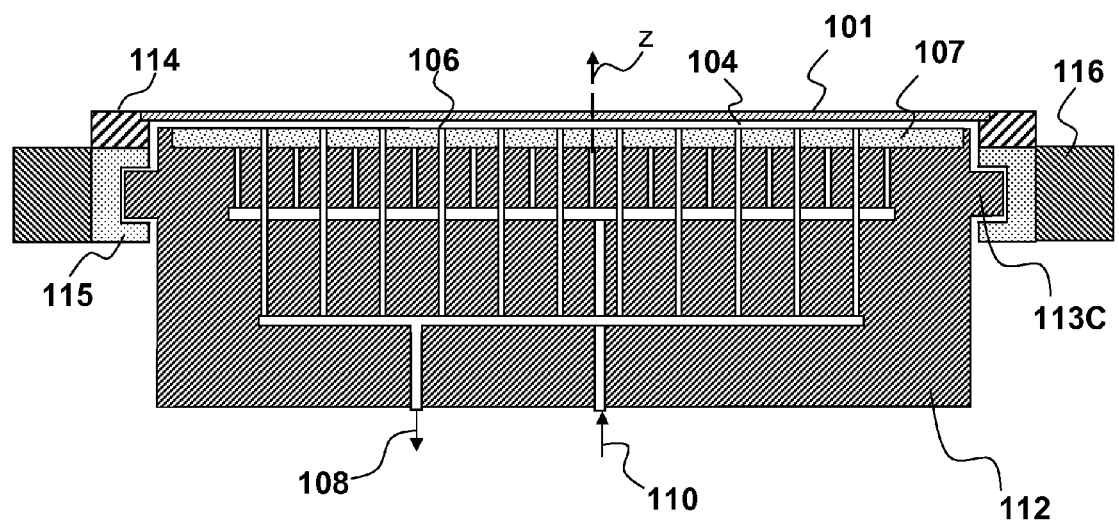

There are a number of different possible configurations for the chuck 112, edge support 114, bearing 115 and rotation mechanism 116. For example, as shown in FIG. 2A, the chuck 112 may include a ridge 113A that protrudes from a surface of the chuck body. The edge support 114 may be mounted to the top of the bearing 115 and the rotation mechanism 116 may engage the bearing 115 peripherally. Alternatively, the ridge 113A may be annular in shape to facilitate guiding the rotation of the edge support 114 with the bearing 115. The bearing 115 may be configured follow the ridge 113A, e.g., mechanically or magnetically. In an alternative configuration shown in FIG. 2B, a ridge 113B may protrude from a separate structure that is located peripherally with respect to a main body of the chuck 112. For example, the ridge 113B may protrude from the rotation mechanism 116 or a portion thereof. In another alternative configuration shown in FIG. 2C, the chuck 112 may include a ridge 113C that protrudes from a side of the chuck body. The bearing 115 may follow the ridge, e.g., mechanically or magnetically. The edge support 114 may be mounted to the top of the bearing 115 and the rotation mechanism 116 may engage the bearing 115 peripherally.

Figure 2D:
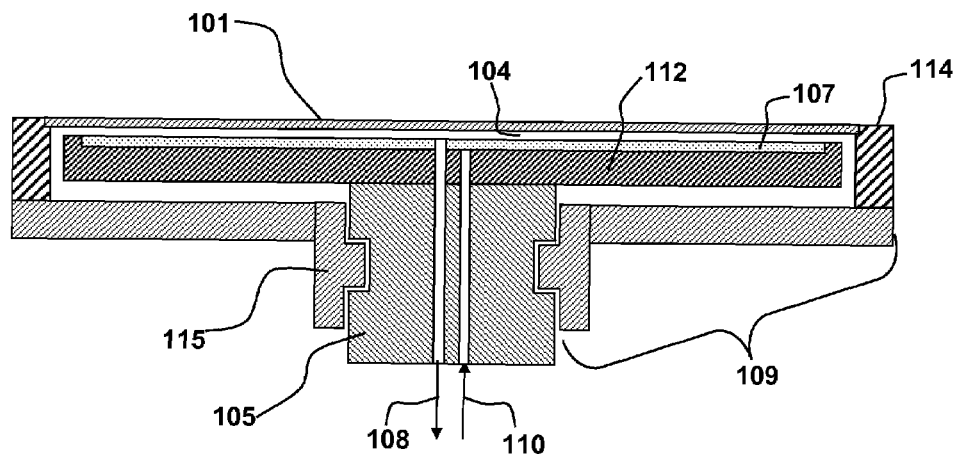

In some embodiments, the functions of the bearing 115 and rotation mechanism 116 may be combined, e.g., by using a maglev motor, e.g., an electric motor having a maglev bearing between its rotor and stator. For example as shown in FIG. 2D, the chuck 112 may be attached to a central stator 105 and the edge support 114 may be attached to a rotor 109 that is concentric with the stator 105. Magnetic forces between a portion of the stator 105 and a nearby portion of the rotor 109 may act as the bearing 115.

Referring again to FIG. 2A, the substrate processing apparatus 100 of the present invention may also include a scanning tool 120 proximate the front surface 101 of the substrate 102. The tool may perform scanning measurement of the front surface 101 of the substrate as the substrate rotates. The scanning tool 120 may include a probe 122 coupled to a scanning mechanism 124. The probe may be an optical tool, e.g., an optical microscope, such as laser or other light source, optical imaging system, wafer inspection tool, or wafer metrology tools such as a reflectometer and/or ellipsometer. The scanning mechanism 124 may scan the probe 122 across a front surface 101 of the substrate 102 in a direction substantially parallel to a plane of rotation of the substrate. With such a configuration, the probe may be scanned relative to the front surface 101 of the substrate 102 in a spiral pattern. Since the chuck 112 does not rotate relative to the probe 122, variations in the height of the chuck surface that are transferred to the substrate tend to remain relatively stationary with respect to the chuck 112 even at high-speed rotation of the substrate. Consequently, the variation in the depth of focus depends on the scanning speed of the probe and not on the much higher tangential velocity of the front surface 101. Thus, the probe 122 having a relatively low bandwidth auto focus may maintain focus on the front surface 101 without modification.

Figure 2E:
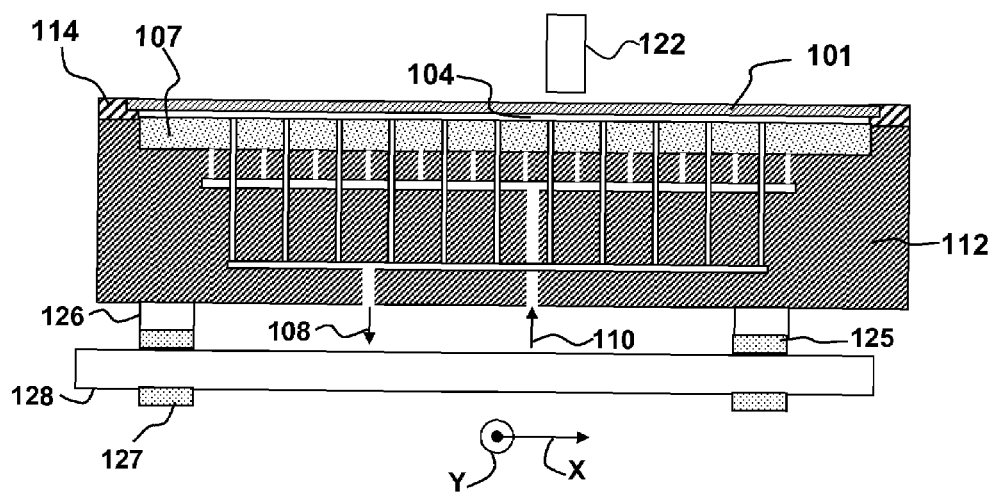

It is noted that the probe 122 may be scanned by moving the probe relative to the substrate or by moving the substrate 101 relative to the probe 122. For example, the chuck 112 may be mounted to an X-Y translation stage that translates the chuck 112 (and edge support 114 and substrate 101) in a plane perpendicular to the z-direction. Furthermore, in embodiments of the invention, relative motion between the probe 122 and the substrate may involve combined motion of both the probe 122 and the chuck 112. In addition, it is noted that in some embodiments, the substrate need not rotate. Embodiments of the present invention may be used in scanning configurations other than spiral scanning. For example, embodiments of the invention may be applied to rectilinear (XY) scanning configurations. For XY scan, the substrate 102 may remain stationary with respect to the chuck, as shown in FIG 2E. For example, as shown in FIG. 2E, the edge support 114 may be directly mounted to the chuck body 112. Translation mechanisms 126, 128 may translate the chuck 112 along Y and X axes respectively, while the probe 122 remains stationary. By way of example, and without loss of generality, the translation mechanisms 126, 128 may include linear actuators, such as linear magnetic motors to impart movement to the chuck 112 along the X- and/or Y-axes. In addition, the translation mechanisms 126, 128 may include mechanical and/or magnetic bearings 125, 127 to guide and/or constrain the motion of the chuck 112.

Figure 2F:
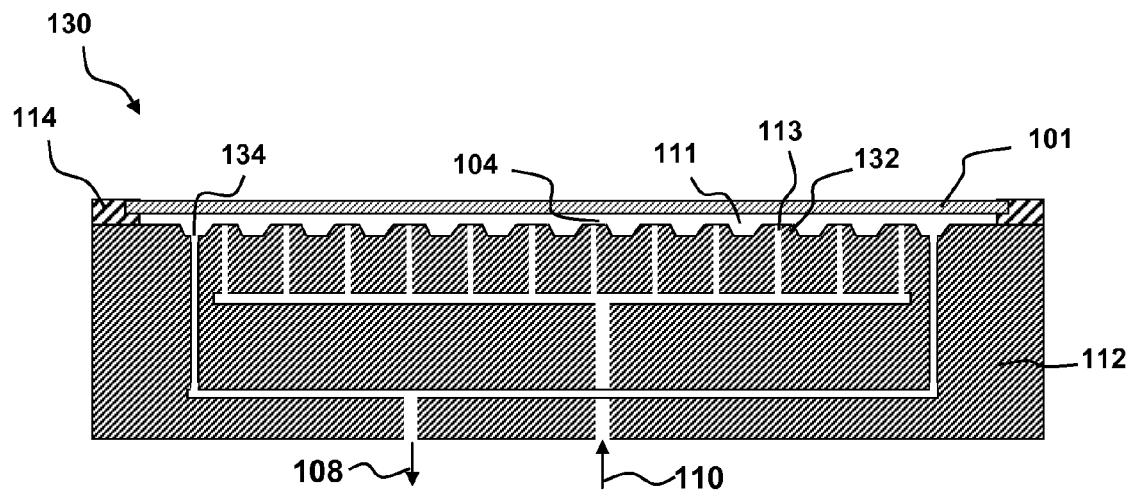
Figure 2G:
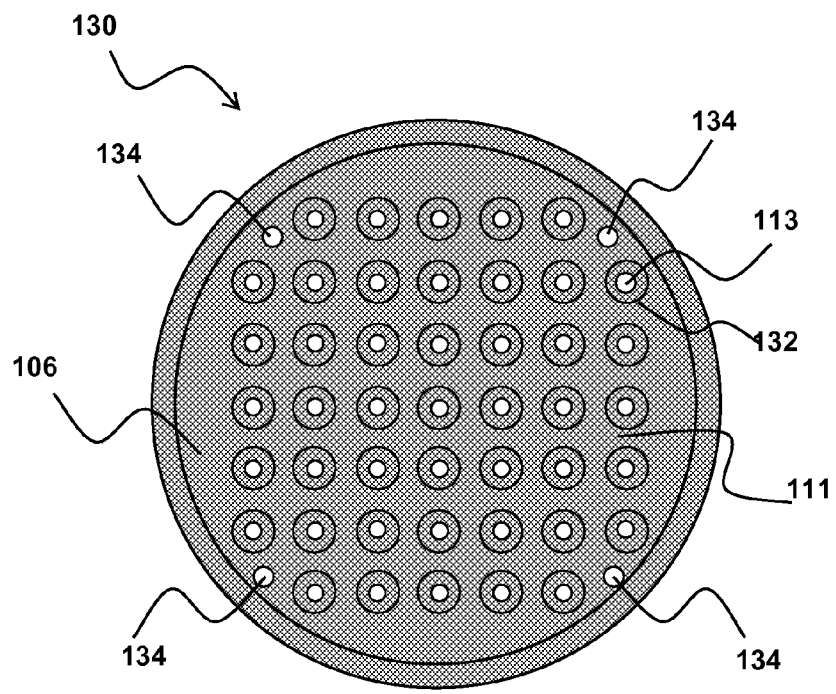
FIG. 2G is a plan view schematic diagram of the apparatus of FIG. 2F.

Although FIG. 1 and FIGS. 2A-2E depict vertical vacuum channels 111 in the chuck surface 106 and a porous material between the gas openings 113 and the chuck surface 106, embodiments of the invention are not limited to such configurations. For example, FIGS. 2F-2G depict an embodiment of a substrate processing apparatus 130 having alternative configuration for the vacuum channels 111 and gas openings 113. The apparatus 130 comprises a chuck body 112 having a surface 106 characterized by a plurality of raised portions 132 with horizontal vacuum channels 111 formed in the surface 106 of the chuck body 112 between neighboring raised portions 132. The vacuum channels 111 are distributed across the surface 106. The vacuum channels 111 communicate with one or more vacuum ports 134 that are coupled to a source of vacuum 108, e.g., via one or more vacuum conduits formed in the chuck body 112. The vacuum channels 111 may provide one or more paths to the vacuum ports 134 along the surface 106. Each raised portion 132 may have a gas opening 113 that communicates with a source of gas 110, e.g., via a network of gas conduits within the chuck body 112. By way of example, the raised areas 132 may be in the form of a grid of raised cylinders with gas opening 113 in the center of each raised area. The spacing and size of the raised areas 132 may be engineered to minimize distortion of the substrate 101, and optimize the stiffness of the air bearing. It is noted that the configuration illustrated in FIGS. 2F-2G may be used as an alternative to or in conjunction with the porous material 107, e.g., as used in the embodiments described above with respect to FIGS. 1-2E.

During rotational or translational movement of the substrate 102 relative to the chuck 112, it is desirable that laminar flow be maintained in the air gap 104 between a back surface 103 of the substrate 102 and the surface of the chuck 112. In general, it is desirable that the Reynolds number for the gas flow in the air gap 104 to be less than about 2000. By keeping Reynolds number relatively low, turbulent torsional Couette flow may be avoided. Reynolds number (Re) is conventionally defined as $Re = 2\pi\Omega rh/v$, where $v =$ is the kinematic viscosity, of the gas in the gap, $\Omega$ is the rotation frequency, and $r$ is the substrate radius. The kinematic viscosity is conventionally defined as the ratio of the absolute (or dynamic) fluid viscosity divided by the density of the gas. For air, the kinematic viscosity $v = 0.15 \times 10^{-4}$ meters$^2$/sec. For a rotational frequency $\Omega \leq 100$ Hz, $h \leq 1 \times 10^{-4}$ meters and $r = 0.15$ meters, $Re \leq 628 << 2000$.

Figure 3:
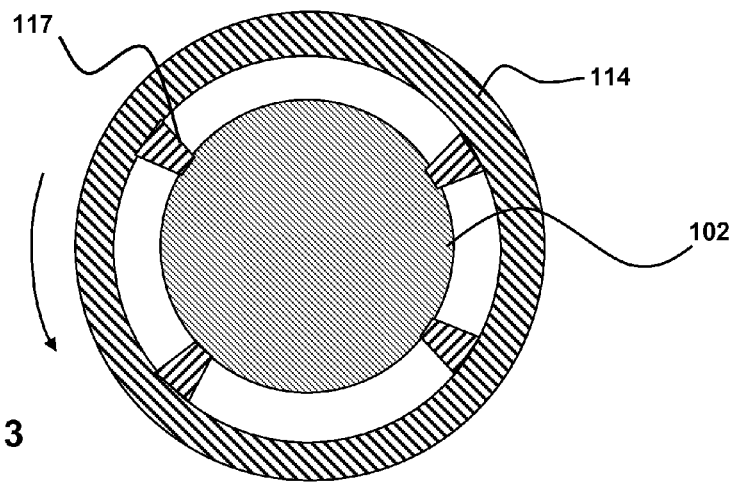
FIG. 3 is a top view of the substrate edge support described in FIG. 2A.

FIG. 3 is a top view of a substrate 102 supported by a substrate edge support 114 in the shape of a ring with edge clamps 117. The edge clamps 117 may be made rigid in a tangential direction to maintain acceleration and accurate rotation coordinates, but slightly flexible in the z direction (perpendicular to the surface of the substrate 102). In this configuration, any height variation due to the spinning mechanism may be absorbed by the clamps 117, while substrate 102 is kept rigid in z direction due to the vacuum preload.

Figure 4:
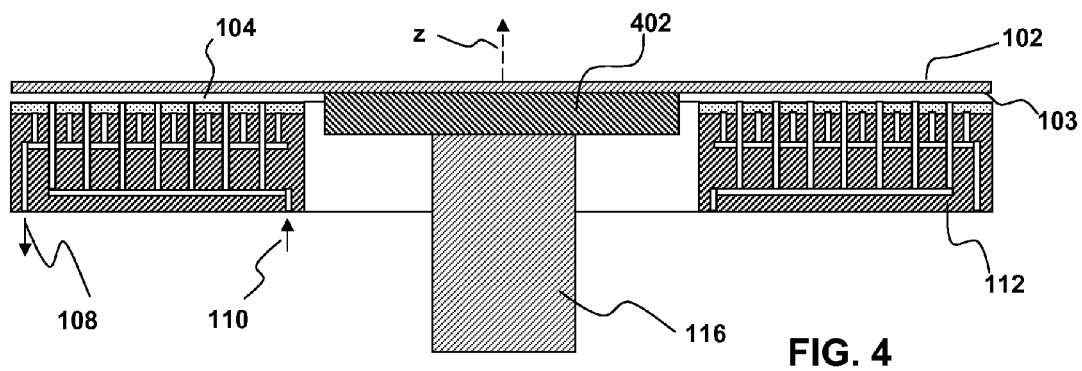
FIG. 4 is a cross-sectional schematic diagram of a substrate processing apparatus including a vacuum preload air bearing chuck with substrate center support.

Alternatively, rotational motion may be imparted to the substrate 102 at its center. For example, as shown in FIG. 4, a vacuum pad 402 may be positioned in a hole in the center of the chuck 112. The vacuum pad 402 may be selectively secured to the substrate 102 at the center of the back surface 103 of the substrate. The vacuum pad 402 may be adapted to rotate about the z axis, which may be oriented such that the substrate 102 rotates in a substantially horizontal plane. The vacuum pad 402 can rotate by imparting a rotational motion from a rotation mechanism 116, e.g., the rotor of an electric motor or a belt or friction drive in conjunction with an electric motor.

Figure 5:
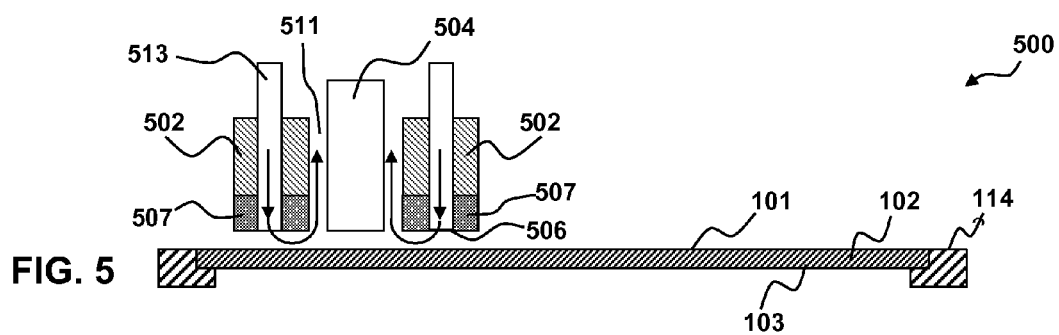
FIG. 5 is a cross-sectional schematic diagram of a vacuum preload air-bearing module applied to the front surface of a substrate.

Furthermore, as shown in FIG. 5, a vacuum preload air bearing module 500 may be applied to the front surface 101 of the substrate to reduce height variations due to the changes in the substrate's thickness. The vacuum preload air bearing module 500 generally includes a chuck body 502 having one or more distributed vacuum channels 511 and one or more distributed gas flow channels 513. In the example shown in FIG. 5, the vacuum channel 511 may have an annular shape. A plurality of annularly distributed gas flow channels 513 may be arranged in a pattern concentric with the vacuum channel 511. A porous material 507 may be disposed between the gas flow openings 513 and a surface 506 of the chuck body to diffuse the flow of gas. Preferably, the vacuum channels 511 and gas flow channels 513 go through the porous material 507 (if any) and surface 506. A probe 504 may be centrally located within the chuck body. The vacuum preload air bearing module 500 may be applied to the front surface 101 of the substrate 102 while the substrate is supported at an edge thereof by a substrate edge support.

Figure 6A:
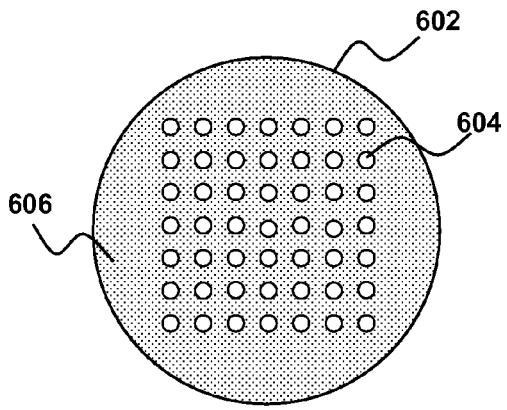
FIGS. 6A-6F are top views of different vacuum regimes of the vacuum preload air bearing chuck.
Figure 6B:
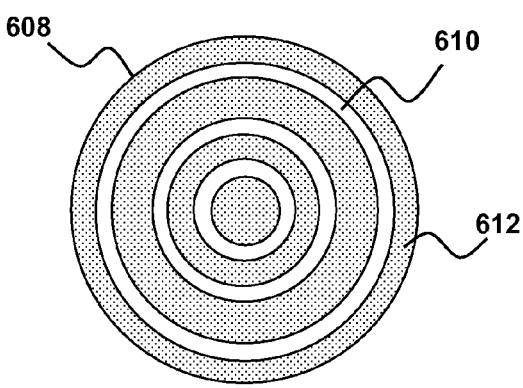
Figure 6C:
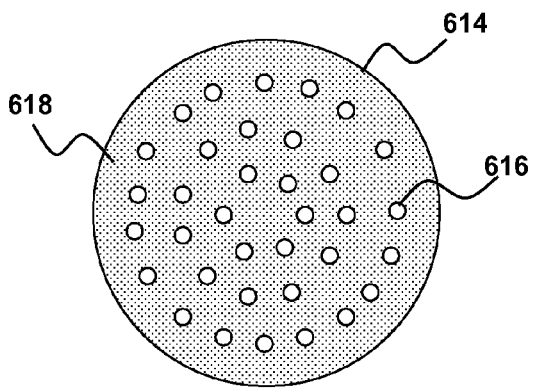
Figure 6D:
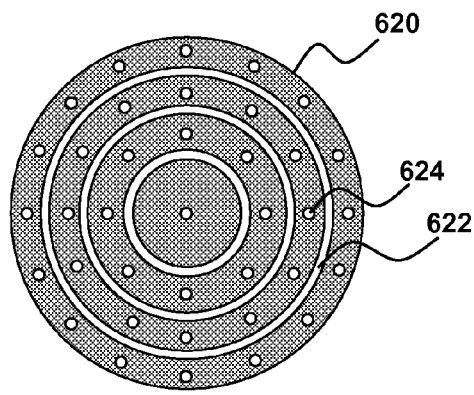

Distribution of the vacuum channels across the surface of the vacuum chuck tends to disperse the chucking force and prevents deformation of thin and flexible wafers that might otherwise result if all of the vacuum were applied at a single location. FIGS. 6A-6F are top views illustrating a few of many possible different distributions of the vacuum channels and the gas flow openings in the surface of the chuck. By way of non-limiting example, in FIG. 6A, the surface of a chuck 602 includes vacuum holes 604 arranged in a rectangular grid pattern and a more or less uniformly distributed air flow area 606. The air flow area 606 may be provided through use of a rectangular grid of gas inlets and a porous material, e.g., as shown in FIG. 1. In FIG. 6B, the surface of a chuck 608 includes a series of alternating concentric annular vacuum channels 610 and annular gas flow areas 612 between the channels. The gas flow areas 612 may be provided through use of annular patterns of gas inlets and a porous material. In FIG. 6C, the surface of a chuck 618 includes vacuum holes 616 arranged in a series of concentric ring patterns and a gas flow area 614. The gas flow area 618 may be provided through use of any suitable pattern of gas inlets and a porous material. FIG. 6D, illustrates an example of a chuck 620 that combines the features of FIG. 6B and FIG. 6C. Specifically, a surface of the chuck 620 may include one or more concentric annular vacuum channels 622. Gas flow openings 624 are arranged in concentric patterns between the vacuum channels 622. The gas flow openings 624 may include a central opening aligned with an axis of symmetry of the concentric vacuum channels 622.

Figure 6E:
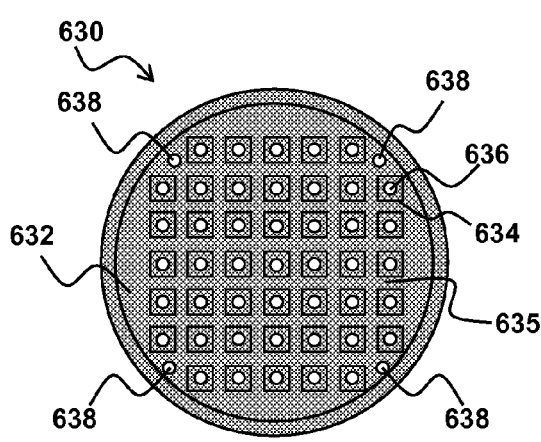
Figure 6F:
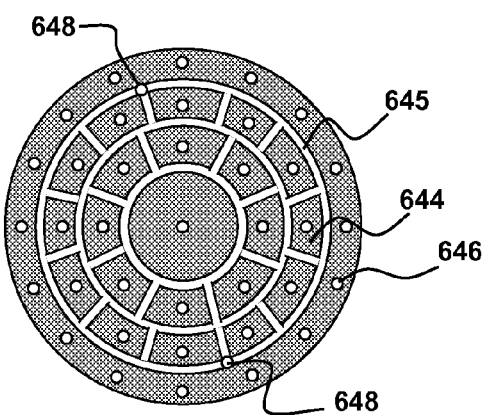

FIGS. 6E and 6F depict alternative vacuum channel configurations to that shown in FIG. 2G. As shown in FIG. 6E, a chuck 630 of the type shown in FIG. 2F, may have a chuck surface 632 with raised areas 634 and vacuum channels 635 in a "waffle iron" type pattern. The raised areas 634 may each have a gas opening 636 and the vacuum channels 635 may communicate with vacuum ports 638. As shown in FIG. 6F, a chuck 640 of the type shown in FIG. 2F, may have a chuck surface with raised areas 644 and interconnected network of annular and radial vacuum channels 645. The raised areas 644 may each have one or more gas openings 646 and the vacuum channels 645 may communicate with vacuum ports 648.

Embodiments of the present invention are not limited by the vacuum and gas inlet configurations shown in FIGS. 6A-6F. Those of skill in the art may devise numerous variations on or combinations of these configurations without departing from the scope of the invention.

Figure 7:
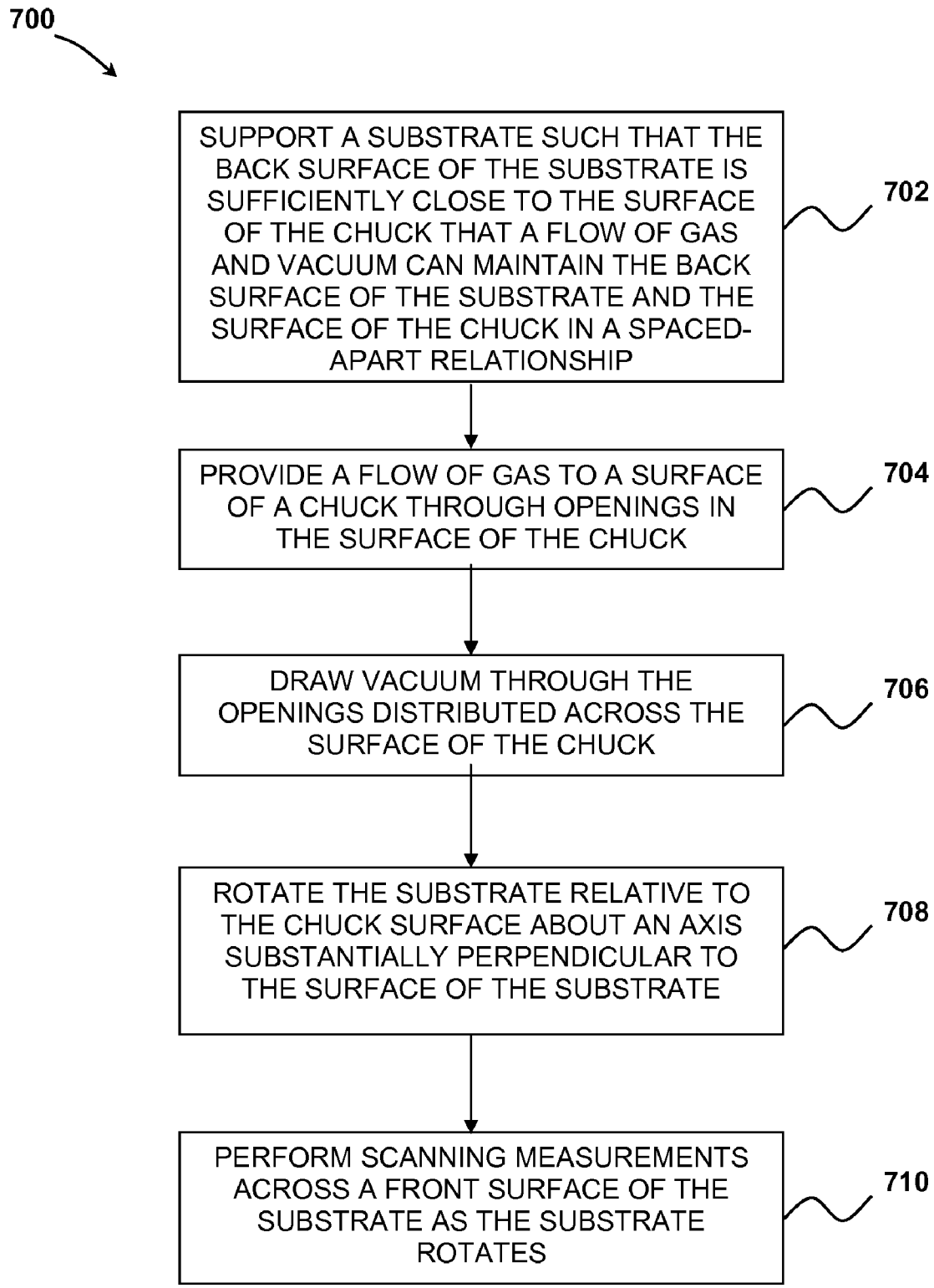
FIG. 7 is a flow diagram that illustrates a substrate processing method according to a preferred embodiment of the present invention.

Apparatus of the type shown and described above may be used in conjunction with substrate processing. FIG. 7 is a flow diagram illustrating a substrate processing method 700 according to an embodiment of the present invention. At 702 a substrate is supported with a back surface of the substrate being sufficiently close to the surface of the chuck that a flow of gas and vacuum can maintain the back surface of the substrate and the surface of the chuck in a spaced-apart relationship. At 704, a flow of gas is provided to a surface of a chuck through one or more openings in the surface at two or more spaced-apart locations distributed across the surface. At 706, vacuum is drawn through one or more channels distributed across the surface of the chuck. A gap between the back surface of the substrate and the surface of the chuck may be adjusted by varying the flow of gas and/or vacuum. The substrate may be supported by securing an edge of the substrate to a ring at three or more places with three or more edge clamps. Alternatively, the substrate could be supported at a small area at the center of the back surface of the substrate. For example, a vacuum pad from a hole at the center of the chuck grabs the back surface of the substrate.

At 708, the substrate is rotated relative to the chuck surface about an axis that is substantially perpendicular to the surface of the substrate in a substantially horizontal plane by imparting a rotational motion to the substrate support, e.g., a ring or vacuum pad. Rotation may be imparted by a rotation mechanism, such as a linear magnetic drive motor, rotor of an electric motor, or belt or friction drive in conjunction with a motor. A rate of rotation of the substrate and/or a rate of flow of gas and/or a rate at which the vacuum is drawn may be chosen so that the substrate substantially conforms to a topography of the surface of the chuck while rotating. The gas flow in a gap between the back surface of the substrate and the surface of the chuck may be characterized by laminar flow.

At 710, a scanning probe scans across the front surface of the substrate to perform scanning measurements while the substrate is rotating in a direction substantially parallel to a plane of rotation of the substrate. By way of example, the substrate may have a diameter greater than about 150, 200, 300 or 450 millimeters. The substrate could be a reticle or a semiconductor wafer. In some embodiments, the substrate, e.g., a semiconductor wafer, may be less than about 1 millimeter thick.

While the above is a complete description of the preferred embodiment of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A substrate processing method, comprising:
   supporting a substrate proximate the surface of the chuck, wherein a back surface of the substrate is sufficiently close to the surface of the chuck that a flow of gas and vacuum can maintain the back surface of the substrate and the surface of the chuck in a spaced-apart relationship;
   providing a flow of gas to a surface of a chuck through one or more openings in the surface of the chuck;
   drawing vacuum through one or more channels distributed across the surface of the chuck, wherein the one or more vacuum channels comprise one or more horizontal channels formed in a surface of the chuck between raised areas of the surface of the chuck; and
   moving the substrate along a direction that is substantially parallel to the surface of the substrate.

2. The method of claim 1, wherein moving the substrate comprises moving the chuck along the direction that is substantially parallel to the surface of the substrate; and maintaining the substrate in a fixed position relative to the chuck.

3. The method of claim 1 wherein moving the substrate along a direction that is substantially parallel to the surface of the substrate comprises rotating the substrate relative to the chuck surface about an axis that is substantially perpendicular to the surface of the substrate.

4. The method of claim 3 wherein supporting the substrate comprises supporting the substrate at an edge thereof.

5. The method of claim 3, further comprising performing scanning measurements across a front surface of the substrate as the substrate rotates.

6. The method of claim 5, wherein performing scanning measurements includes scanning a probe in a direction substantially parallel to a plane of rotation of the substrate as the substrate rotates.

7. The method of claim 3 wherein supporting the substrate at an edge thereof comprises securing the edge to a ring at three or more places.

8. The method of claim 7 wherein rotating the substrate relative to the chuck surface comprises rotating the ring relative to the chuck surface about an axis that is substantially perpendicular to the surface of the chuck.

9. The method of claim 3 wherein providing the flow of gas comprises providing the gas at two or more spaced-apart locations distributed across the surface.

10. The method of claim 9 wherein the substrate is less than about 1 millimeter thick.

11. The method of claim 10 wherein the substrate is greater than about 150, 200, 300 or 450 millimeters in diameter.

12. The method of claim 10 wherein the substrate is a semiconductor wafer.

13. The method of claim 3 wherein rotating the substrate comprises rotating the substrate in a substantially horizontal plane.

14. The method of claim 13, wherein a rate of rotation of the substrate and/or a rate of flow of gas and/or a rate at which the vacuum is drawn is/are chosen so that the substrate substantially conforms to a topography of the surface of the chuck while rotating.

15. The method of claim 13 wherein a rate of rotation of the substrate and/or a rate of flow of the gas and/or a rate at which the vacuum is drawn is/are chosen so that gas flow in a gap between the back surface of the substrate and the surface of the chuck is characterized by laminar flow.

16. A substrate processing method, comprising:
    supporting a substrate proximate the surface of the chuck, wherein supporting the substrate comprises supporting the substrate at a center of the substrate, wherein a back surface of the substrate is sufficiently close to the surface of the chuck that a flow of gas and vacuum can maintain the back surface of the substrate and the surface of the chuck in a spaced-apart relationship;
    providing a flow of gas to a surface of a chuck through one or more openings in the surface of the chuck;
    drawing vacuum through one or more channels distributed across the surface of the chuck; and
    rotating the substrate relative to the chuck surface about an axis that is substantially perpendicular to the surface of the substrate.

17. The method of claim 16 wherein supporting the substrate at the center comprises grabbing the substrate with a vacuum pad from a hole at the center of the chuck.

18. The method of claim 17 wherein rotating the substrate relative to the chuck surface comprises rotating the vacuum pad about an axis that is substantially perpendicular to the surface of the chuck.

19. A substrate processing apparatus, comprising:
    a chuck having a surface, wherein the surface includes one or more gas flow openings configured to provide a flow of gas to the surface, wherein the surface includes one or more vacuum channels distributed across the surface of the chuck, wherein the vacuum channels are configured to permit vacuum to be drawn therethrough, wherein the one or more vacuum channels comprise one or more horizontal channels formed in a surface of the chuck between raised areas of the surface of the chuck.

20. The apparatus of claim 19 wherein the one or more vacuum channels comprise one or more vertical channels formed in a body of the chuck.

21. The apparatus of claim 19 wherein the one or more gas flow openings are formed in the raised areas.

22. The apparatus of claim 19 wherein the gas flow openings comprise one or more vertical gas conduits formed in a body of the chuck.

23. The apparatus of claim 22, further comprising a porous material disposed between the gas flow openings and the surface of the chuck.

24. The apparatus of claim 19, further comprising a substrate support configured to support a substrate in an orientation substantially parallel to the surface of the chuck wherein the substrate support is adapted to move along a direction that is substantially parallel to the surface of the substrate.

25. The apparatus of claim 24 wherein the substrate support is adapted to translate along one or more axes that are substantially parallel to the surface of the substrate.

26. The apparatus of claim 24 wherein the substrate support is attached to the chuck and the chuck is adapted to translate along the one or more axes.

27. The apparatus of claim 24 wherein the substrate support is adapted to rotate about an axis that is substantially perpendicular to the surface of the substrate; and
a rotation mechanism configured to impart rotational motion to the substrate support about the axis.

28. The apparatus of claim 24, further comprising, one or more mechanisms configured to impart motion to the substrate support along the direction that is substantially parallel to the surface of the substrate.

29. The apparatus of claim 28 wherein the one or more mechanisms include a rotation mechanism configured to impart rotational motion to the substrate support about the axis.

30. The apparatus of claim 28, wherein the substrate support is configured to rotate the substrate in a substantially horizontal plane.

31. The apparatus of claim 28 wherein the one or more gas flow openings and two or more vacuum channels are positioned at spaced-apart locations distributed across the surface.

32. The apparatus of claim 28, further comprising a scanning tool including a probe coupled to a scanning mechanism, wherein the scanning mechanism is configured to scan the probe across a front surface of the substrate as the substrate rotates.

33. The apparatus of claim 32, wherein the scanning mechanism is configured to scan the probe in a direction substantially parallel to a plane of rotation of the substrate as the substrate rotates.

34. The apparatus of claim 28, wherein the substrate support is a substrate center support.

35. The apparatus of claim 34, wherein the substrate center support is positioned at a hole at the center of the chuck.

36. The apparatus of claim 35, wherein the substrate center support includes a vacuum pad configured to grab the center of the substrate.

37. The apparatus of claim 36, wherein the vacuum pad is configured to rotate about an axis that is substantially perpendicular to the surface of the chuck.

38. The apparatus of claim 28, wherein the substrate support is a substrate edge support.

39. The apparatus of claim 38, wherein the substrate edge support is proximate the surface of the chuck in a fixed positional relative to the chuck, wherein the substrate edge support is configured to support the substrate by an edge of the substrate in an orientation substantially parallel to the surface of the chuck.

40. The apparatus of claim 38 wherein the substrate edge support includes a ring and three or more edge clamps configured to secure the edge of the substrate to the ring at three or more places.

41. The apparatus of claim 40, wherein the ring is configured to rotate relatively to the chuck surface about an axis that is substantially perpendicular to the surface of the chuck.

* * * * *